United States Patent
Slesazeck et al.

(10) Patent No.: US 7,189,617 B2
(45) Date of Patent: Mar. 13, 2007

(54) MANUFACTURING METHOD FOR A RECESSED CHANNEL ARRAY TRANSISTOR AND CORRESPONDING RECESSED CHANNEL ARRAY TRANSISTOR

(75) Inventors: Stefan Slesazeck, Dresden (DE); Alexander Sieck, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/105,580

(22) Filed: Apr. 14, 2005

(65) Prior Publication Data
US 2006/0234451 A1 Oct. 19, 2006

(51) Int. Cl.
*H01L 21/336* (2006.01)

(52) U.S. Cl. ............... 438/259; 438/589; 257/330; 257/E21.384; 257/E21.419; 257/E21.428; 257/E21.626; 257/E21.64

(58) Field of Classification Search ............... 438/259, 438/270, 282, 303, 589, 595, 294, 443, 444, 438/700, 739, 445; 257/330, E21.626, E21.64, 257/E21.384, E21.419, E21.428
See application file for complete search history.

(56) References Cited

U.S. PATENT DOCUMENTS

| | | | |
|---|---|---|---|
| 6,930,062 B2 * | 8/2005 | Hyun et al. | 438/790 |
| 7,060,574 B2 * | 6/2006 | Kim et al. | 438/297 |
| 2002/0081799 A1 * | 6/2002 | Kim | 438/233 |
| 2005/0042833 A1 * | 2/2005 | Park et al. | 438/282 |

* cited by examiner

*Primary Examiner*—Quoc Hoang
(74) *Attorney, Agent, or Firm*—Morrison & Foerster LLP

(57) ABSTRACT

The present invention relates to a manufacturing method for a recessed channel array transistor and a corresponding recessed channel array transistor. In one embodiment, the present invention uses a self-adjusting spacer on the substrate surface to provide the required distance between the gate and the source/drain regions. Thus, the requirements regarding the tolerances of the lithography in the gate contact plane are diminished.

9 Claims, 18 Drawing Sheets

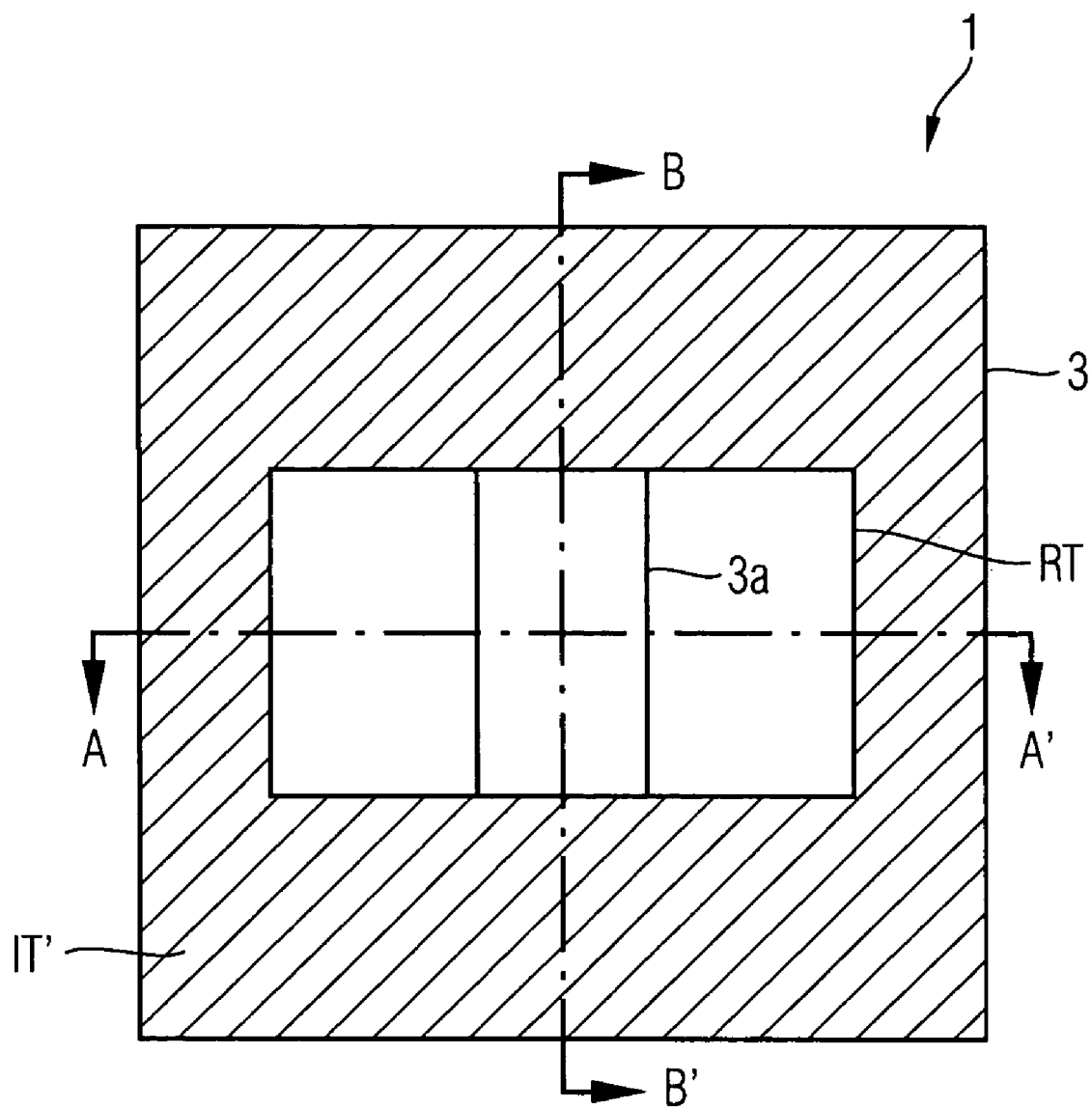

MANUFACTURING METHOD FOR A RECESSED CHANNEL ARRAY TRANSISTOR AND CORRESPONDING RECESSED CHANNEL ARRAY TRANSISTOR

TECHNICAL FIELD OF THE INVENTION

The present invention relates to a manufacturing method for a recessed channel array transistor and a corresponding recessed channel array transistor.

BACKGROUND OF THE INVENTION

Although in principle applicable to arbitrary integrated circuits, the following invention and the underlying problems will be explained with respect to integrated memory circuits in silicon technology.

U.S. Patent Publication 2005/0042833 A1, discloses a method of manufacturing an integrated circuit device including a recessed channel transistor. The method includes the steps of defining an active region by forming a trench device isolation region on an integrated circuit substrate, forming a mask pattern on the integrated substrate that exposes a channel sub-region of the active region and the trench device isolation region adjacent to the channel sub-region, etching the trench device isolation region which is exposed by the mask pattern to be recessed to a first depth using the mask pattern as an etch mask, etching the channel sub-region to form a gate trench having a second depth that is deeper than the first depth using the mask pattern as an etch mask, and forming a recessed gate that fills the gate trench.

FIG. 15 shows schematic planar view of the geometric arrangement of a recessed channel array transistor as an example of the problems underlying the present invention.

In FIG. 15 a schematic planar view of the active region RT and the isolation region of a recessed channel array transistor is shown. Two cross-sections of the planar view of FIG. 15 are denoted A–A' and B–B', respectively.

FIGS. 15A, 7B show two different schematic cross-sections along lines A–A' and B–B' of FIG. 15, respectively, of a manufacturing method for a recessed channel array transistor and a corresponding recessed channel array transistor as an example of the problems underlying the present invention.

FIG. 15A shows a cross-section in parallel to the current flow direction, whereas FIG. 15B shows a cross-section perpendicular to the current flow direction.

In FIG. 15A, reference sign 1 denotes the silicon semiconductor substrate. Provided in the silicon semiconductor substrate 1 are isolation trenches IT filled with silicon oxide. In the middle of the transistor cell there is a trench 5 in the flow direction filled with a gate electrode 30 made of polysilicon. Not shown on the trench wall is a gate dielectric 20 made of silicon dioxide. Source and drain regions 40, 50 are provided in the surface area on both sides of the trench 5. Moreover, reference sign 60 denotes a gate electrode contact made of tungsten, and 70 denotes a nitride spacer on both sides of the gate electrode 30 and the gate electrode contact 60.

Problems in such recessed channel array transistors are caused by the overlap of the vertical gate 30 with the highly doped source/drain regions 40, 50. This overlap causes high electrical fields that generate leakage currents in the turned-off state of the transistor. Provided that the planar gate and thus the spacer 70 can be aligned sufficient above the recessed channel device, it can prevent high doping concentrations directly at the gate edge when used as source/drain implant mask. The scalability of the recessed channel array transistor is therefore limited by the alignment of the planar gate.

SUMMARY OF THE INVENTION

The present invention provides an improved manufacturing method for a recessed channel array transistor and corresponding recessed channel array transistor which provide excellent scalability.

In one embodiment, the present invention uses a self-adjusting spacer on the substrate surface to provide the required distance between the gate and the source/drain regions. Thus, the requirements regarding the tolerances of the lithography in the gate contact plane are diminished.

According to a preferred embodiment, the steps of depositing and structuring a gate contact layer and an isolation layer above said gate electrode and the spacers are performed.

According to another preferred embodiment, the step of forming second isolating spacers on the structured gate contact layer and isolation layer above the gate electrode and said spacers is performed.

According to another preferred embodiment, the step of introducing impurities into the substrate in the forming area for providing lightly doped source/drain regions after the step of providing said gate electrode and before the step of forming the spacers is performed.

BRIEF DESCRIPTION OF THE DRAWINGS

The invention is described below in detail with reference to the drawings and exemplary embodiments.

In the Figures:

FIG. 1 shows a schematic planar view of the geometric arrangement of a recessed channel array transistor as a first embodiment of the present invention.

FIGS. 1A,1B–7A,7B show two different schematic cross-sections along lines A–A' and B–B', respectively, of FIG. 1 of a manufacturing method for a recessed channel array transistor and a corresponding recessed channel array transistor as the first embodiment of the present invention.

FIGS. 8A,8B–14A,14B show two different schematic cross-sections along lines A–A' and B–B', respectively, of FIG. 1 of a manufacturing method for a recessed channel array transistor and a corresponding recessed channel array transistor as the second embodiment of the present invention.

In the Figures, identical reference signs denote equivalent or functionally equivalent components.

DETAILED DESCRIPTION OF THE INVENTION

Figure 1A:
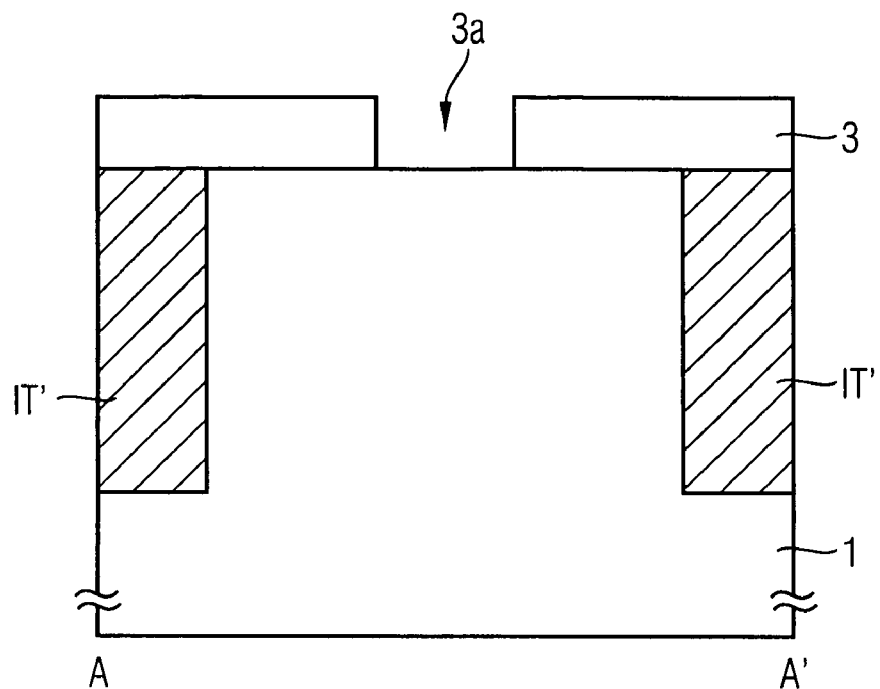
Figure 1B:
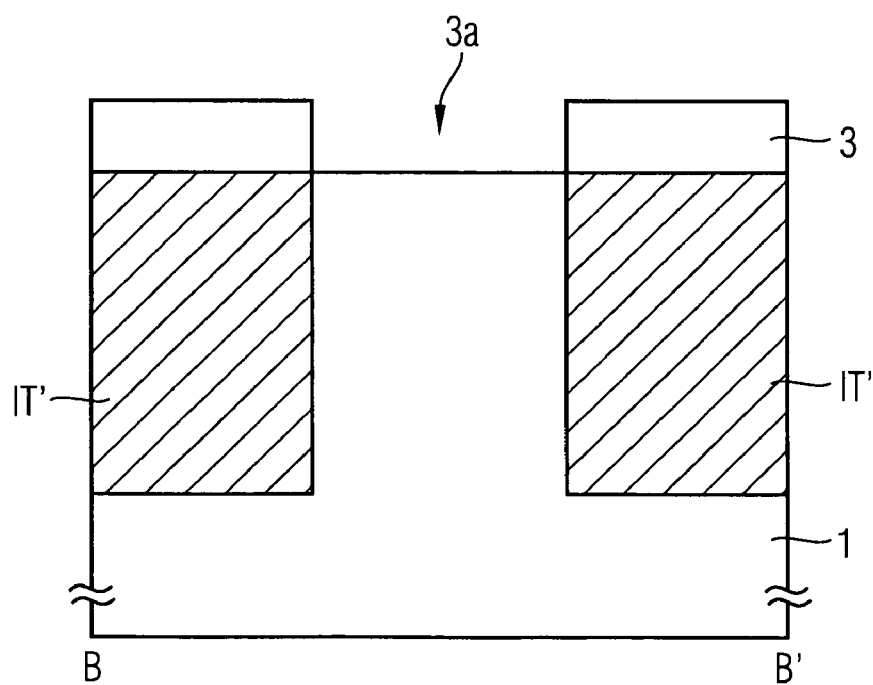

FIG. 1 shows a schematic planar view of the geometric arrangement of a recessed channel array transistor as a first embodiment of the present invention, and FIGS. 1A,B show two different schematic cross-sections along lines A–A' and B–B', respectively, of FIG. 1.

In FIG. 1, reference sign 1 denotes a semiconductor substrate having a nitride sacrificial layer 3 on its surface and having isolation trenches IT' adjoining a forming area RT for said recessed channel array transistor, said isolation trenches IT' being filled with $SiO_2$ as an isolation material which extends to a same upper surface as said substrate 1. In particular, such an arrangement may be obtained by a CMP (chemical mechanical polishing) process.

Thereafter, a sacrificial layer opening 3a is formed in said sacrificial layer 3 which extends in the direction B–B' and exposes said substrate 1 in the middle part of said forming area RT. The opening 3a defines the location of a trench 5 to be etched in the substrate 1 in the following step.

Figure 2A:
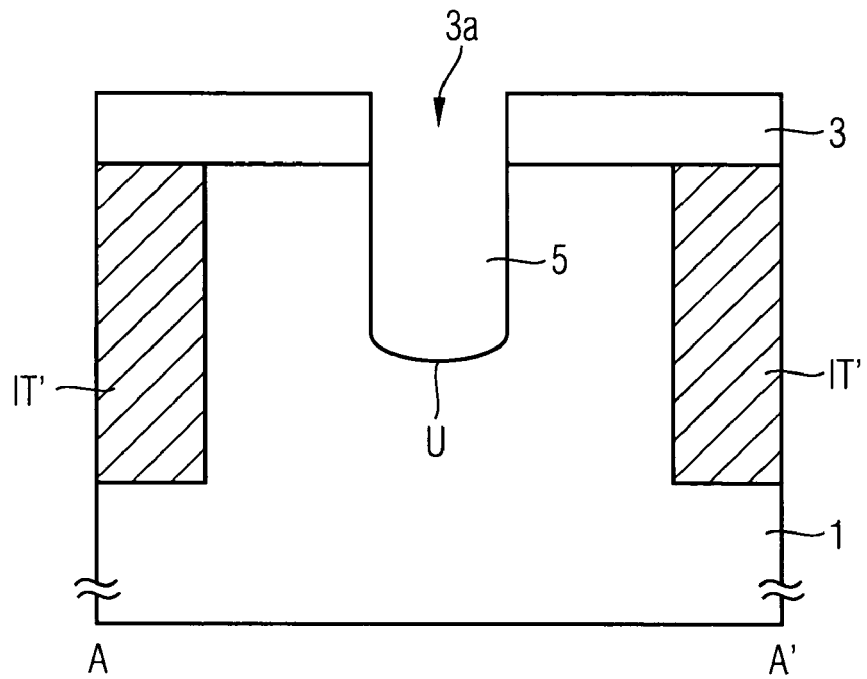

FIGS. 2A,B to 7A,B show the two different schematic cross-sections along lines A–A' and B–B', respectively, of FIG. 1 of a manufacturing method for a recessed channel array transistor and a corresponding recessed channel array transistor as the first embodiment of the present invention which starts from FIGS. 1A,B.

Figure 2B:
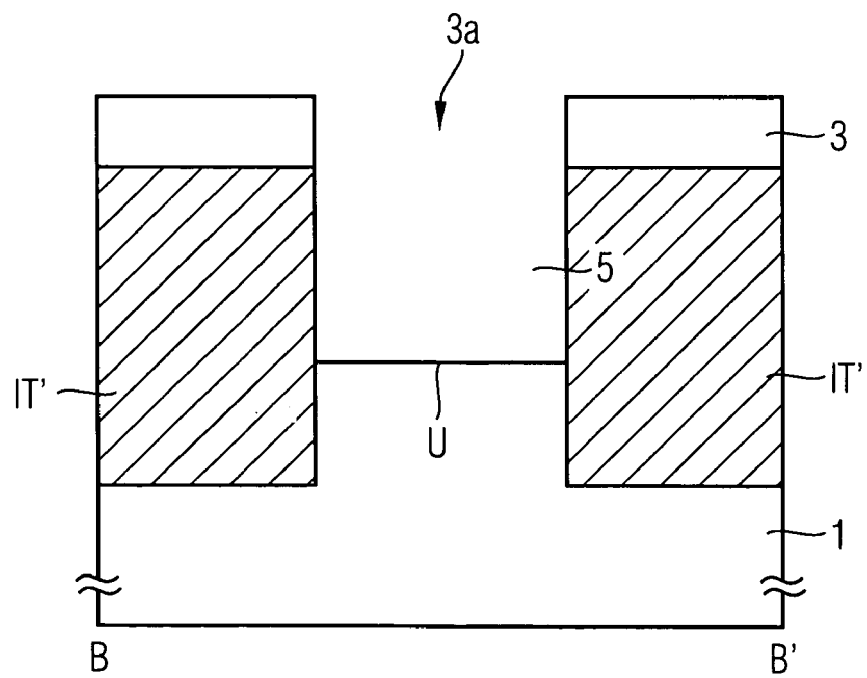

In the following process step which is depicted in FIGS. 2A, 2B, the trench 5 of the recessed channel array transistor is provided by a dry etch process. Reference sign U denotes the bottom of the trench 5. The dry etch process is a selective etching process which etches silicon with high selectivity with respect to the sacrificial layer 3 which in this step acts as a hard mask.

Figure 3A:
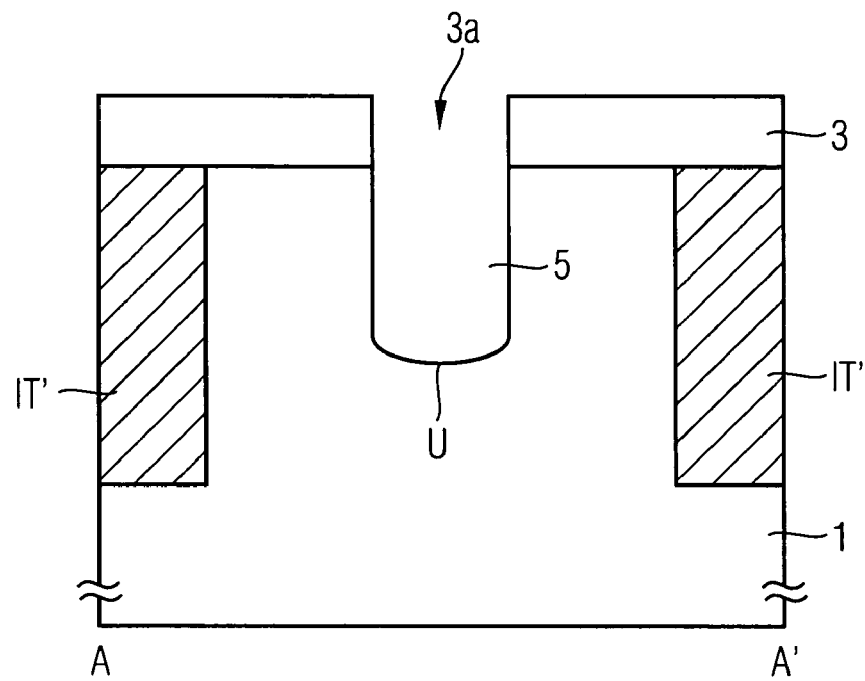
Figure 3B:
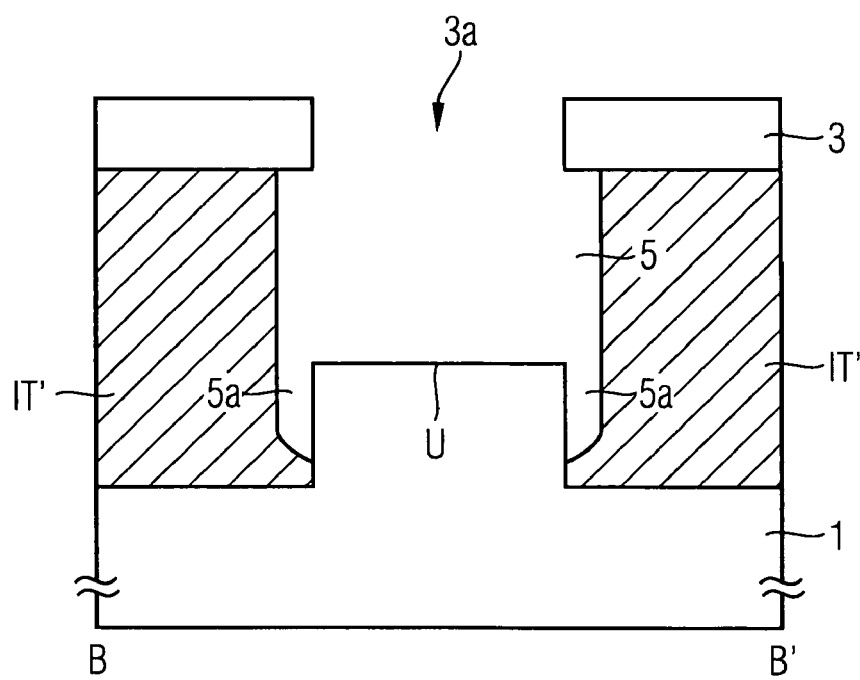

In the next process step which is depicted in FIGS. 3A, 3B, a wet etch is performed for removing a part of the silicon oxide of the isolation trenches IT' adjacent to the trench 5 in the direction B–B' as may be clearly obtained from FIG. 3B. This wet etch step etches silicon oxide with high selectivity with respect to the silicon of the silicon substrate 1. In this wet etch step, the trench 5 is broadened in the B–B' direction and underetching areas 5a are formed along the B–B' direction which underetching areas 5a are located below the bottom U of the trench 5 and which are adjacent to the trench 5. By providing these under-etching areas 5a, the control of the gate over the channel region is improved by the tri-gate arrangement, because the gate can be extended to below the corners at the bottom U.

Figure 4A:
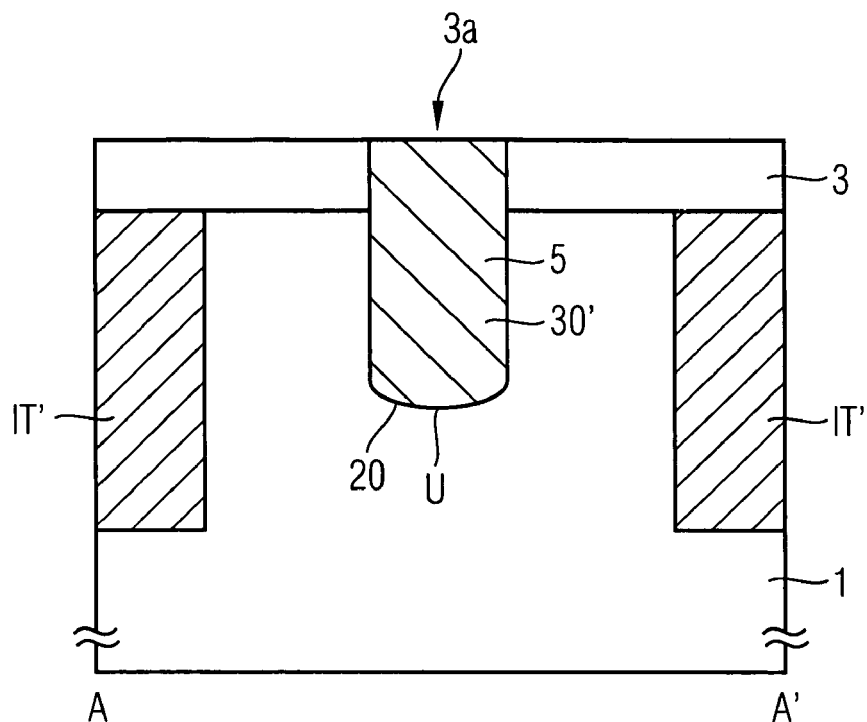
Figure 4B:
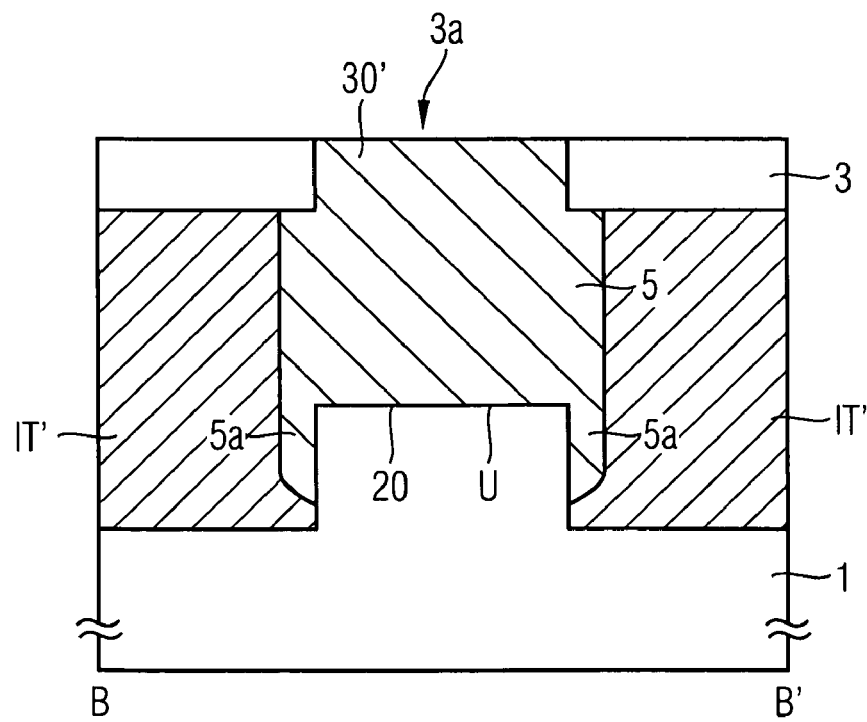

Subsequently, as shown in FIGS. 4A, 4B, a gate dielectric 20 of silicon dioxide is formed along the substrate 1 in the trench 5. Then, the trench 5 and the adjacent under-etched areas 5a in the isolation trenches IT are filled with the gate electrode 30' made of polysilicon, preferably by a deposition and a following CMP process step. The gate electrode 30' made of polysilicon then extends to the surface of the sacrificial layer 3.

Figure 5A:
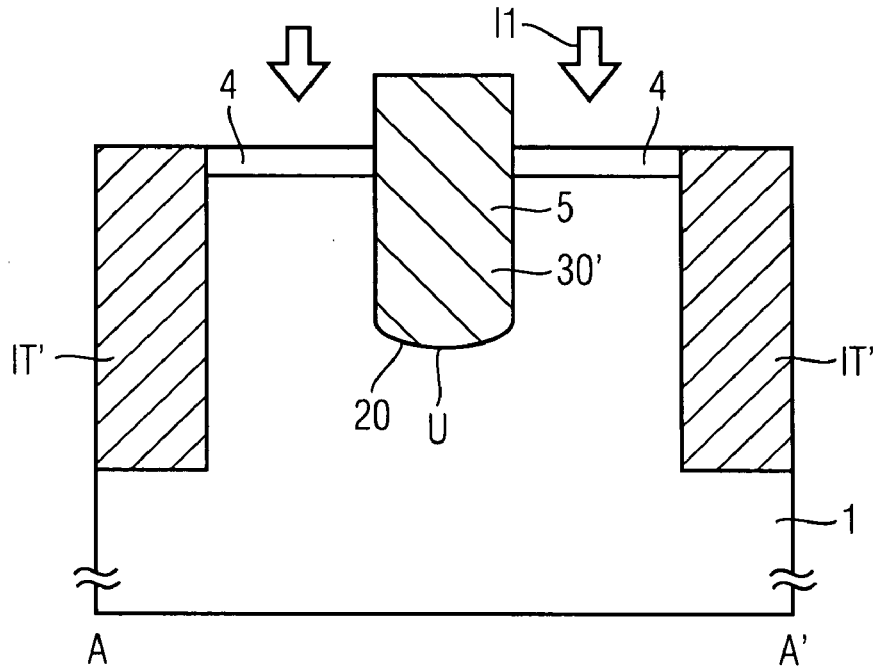
Figure 5B:
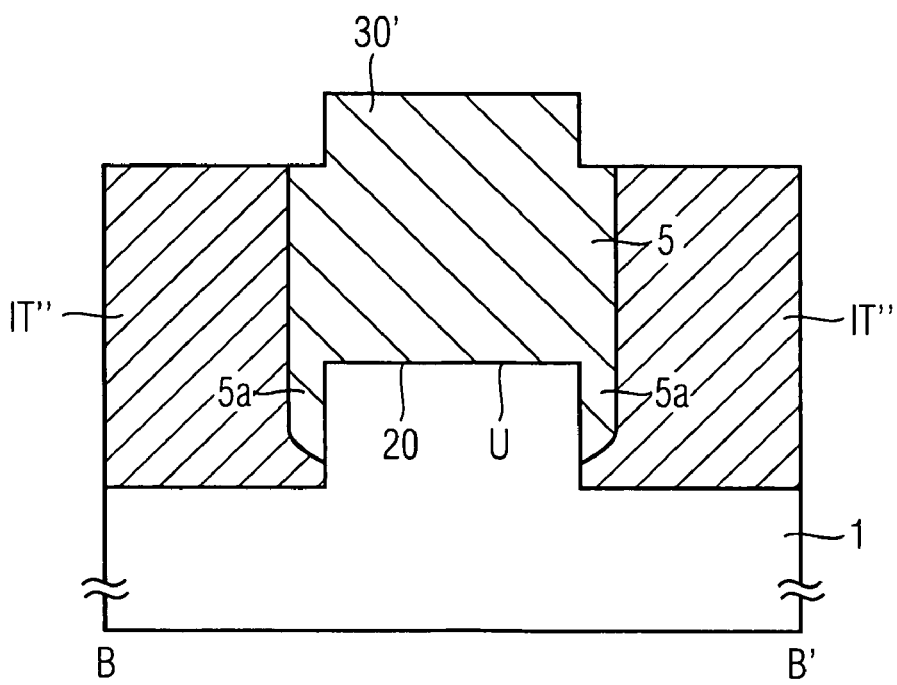

With regard to FIGS. 5A, 5B, the sacrificial layer layer 3 of silicon nitride is then removed in a selective etching step. Moreover, a first implantation I1 is performed in a self-aligned manner in order to provide a lightly doped drain/source region 4 on both sides of the trench 5 as may be obtained from FIG. 4A.

Figure 6A:
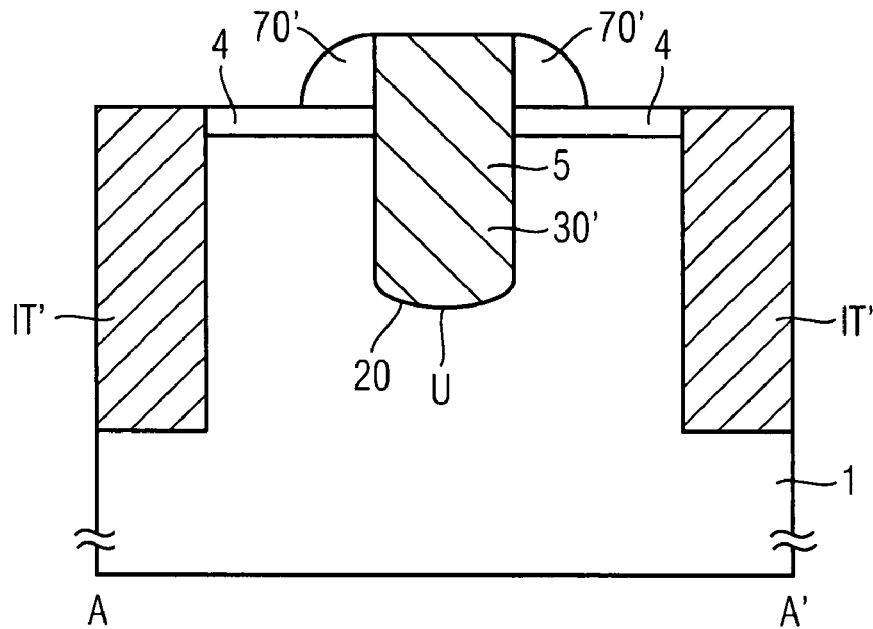
Figure 6B:
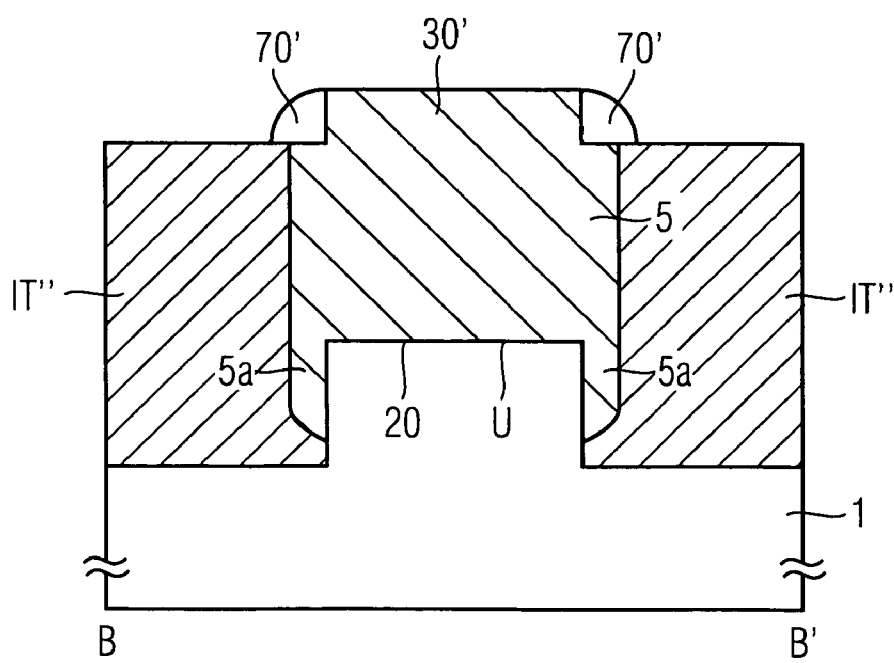

In a following process step which is depicted in FIGS. 6A, 6B, after a subsequent nitride deposition, spacers 70' are formed adjacent to the polysilicon gate electrode 30' which spacers extend along the A–A' and B–B' direction. These self-adjusting spacers 70' made of silicon nitride prevent adverse electric field effects in the turned-off state of the recessed channel array transistor and provide the possibility of alignment tolerances in a later gate contact forming step.

Figure 7A:
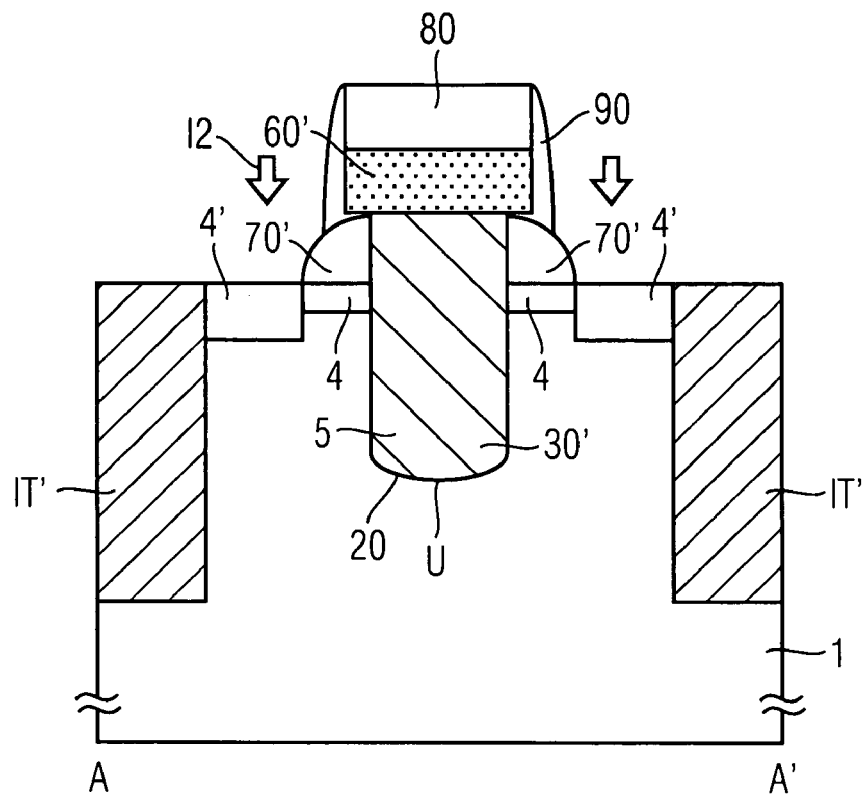
Figure 7B:
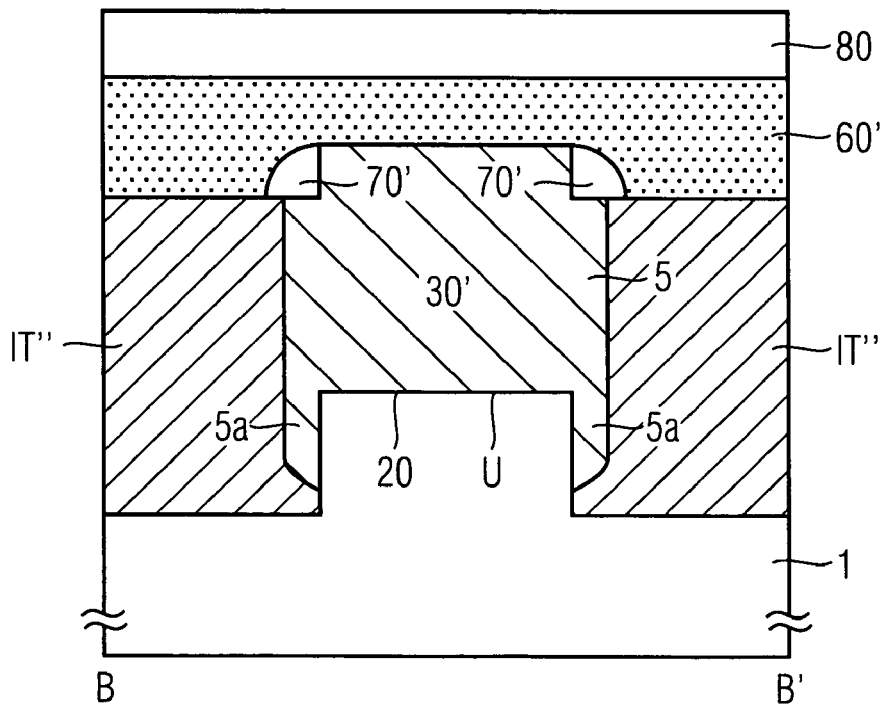

According to FIGS. 7A, 7B, a gate contact layer 60' and a cap nitride layer 80 are deposited and structured over the gate electrode 30' and the self-adjusted nitride spacer 70'. This process step is not sensitive against slight misalignments of the sacrificial layer for structuring the layers 60', 80. In a next process step, second silicon nitride spacers 90 are formed on the sides of the layer 60', 80 and on the first spacers 70'.

When combining the deposition of said gate contact layer 60' with the formation of the gate contact layer of planar support devices in memory applications, a gate dielectric which is formed before the deposition of said gate contact layer has to be removed from the gate electrode 30 to ensure electrical contact between gate contact layer 60' and the gate electrode 30.

Finally, a second implantation I2 is performed for providing source/drain regions 4'. Also, this implantation I2 is self-adjusted by the isolation trenches IT and the spacers 70'. Due to the presence of the lightly doped source/drain areas 4, it can be assured that the source/drain regions 4' are suitably connected to the channel region along the trench 5 periphery. In order to expand the implanted source/drain areas 4', it is possible to perform an additional thermal diffusion step. Thus, by the method of this first embodiment of the present invention, a recessed channel area transistor may be formed which has excellent scaling characteristics.

Figure 8:
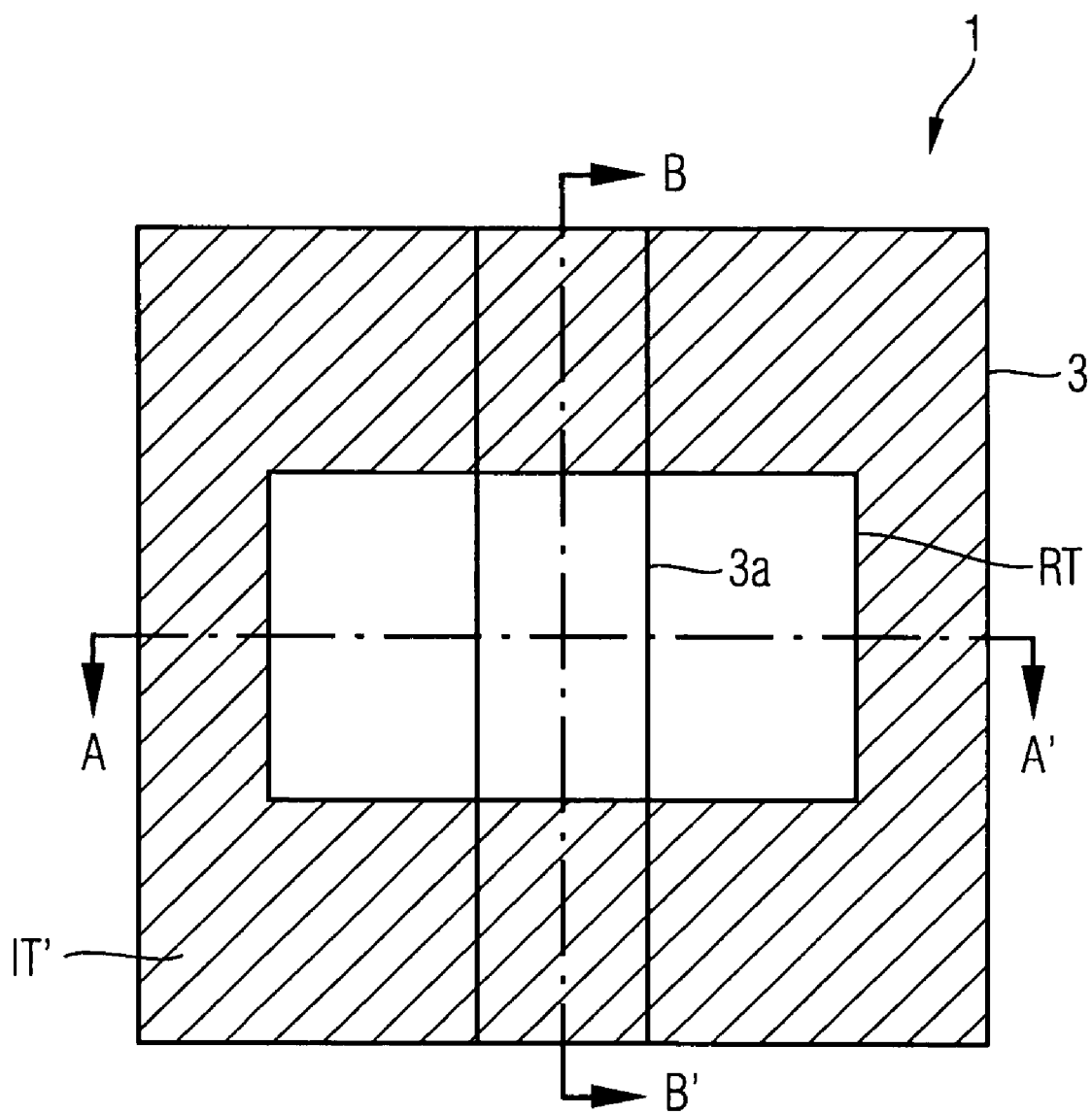
FIG. 8 shows a schematic planar view of the geometric arrangement of a recessed channel array transistor as a second embodiment of the present invention.
Figure 8A:
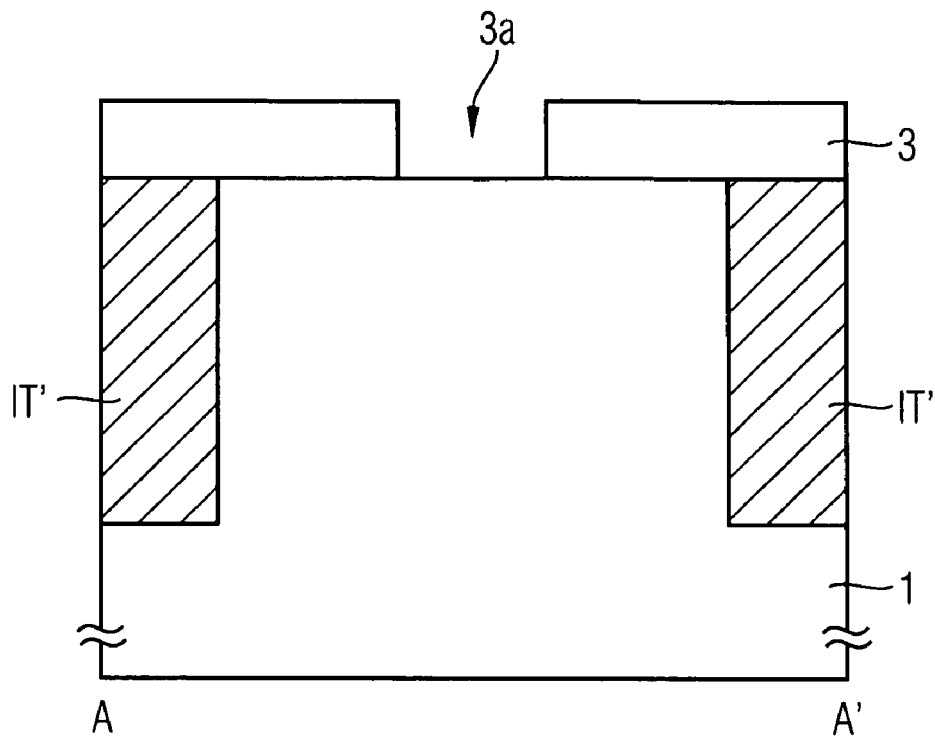
Figure 8B:
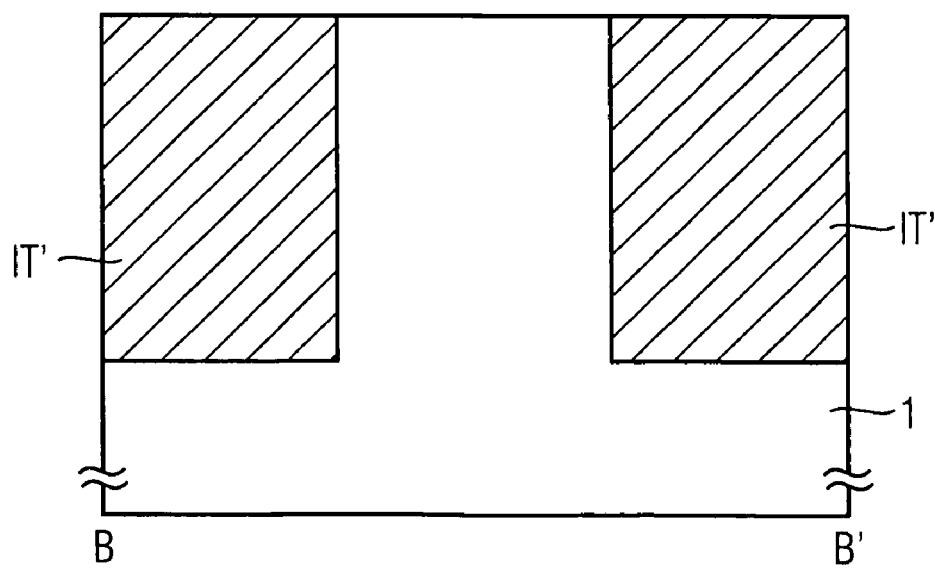

FIG. 8 shows a schematic planar view of the geometric arrangement of a recessed channel array transistor as a second embodiment of the present invention, and FIGS. 8A,B show two different schematic cross-sections along lines A–A' and B–B', respectively, of FIG. 8.

In contrast to the above described first embodiment, here a sacrificial layer opening 3a is formed in said sacrificial layer 3 which extends in the direction B–B' and exposes not only said substrate 1 in the middle part of said forming area RT, but also the adjoining isolation trenches IT' in this direction. The opening 3a defines the location of a trench 5 to be etched in the substrate 1 and in the isolation trenches IT' in the following step.

Figure 9A:
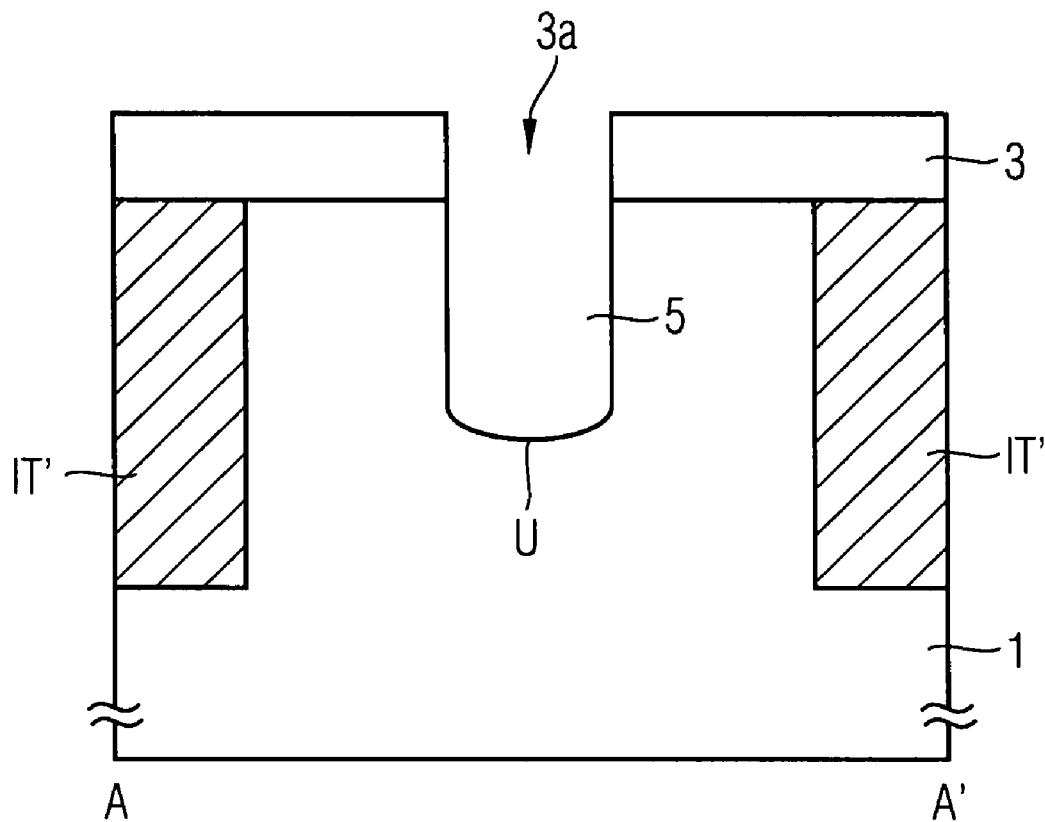

FIGS. 9A,B to 15A,B show the two different schematic cross-sections along lines A–A' and B–B', respectively, of FIG. 8 of a manufacturing method for a recessed channel array transistor and a corresponding recessed channel array transistor as the first embodiment of the present invention which starts from FIGS. 8A,B.

Figure 9B:
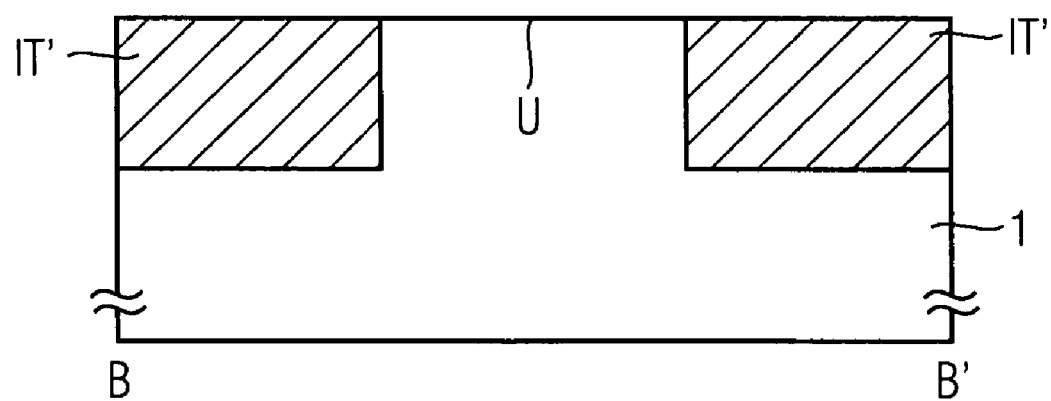

In the following process step which is depicted in FIGS. 9A, 9B, the trench 5 of the recessed channel array transistor is provided by a dry etch process. Reference sign U denotes the bottom of the trench 5. The dry etch process is a selective etching process which etches silicon and silicon oxide with high selectivity with respect to the sacrificial layer 3 which in this step acts as a hard mask. As may be seen from FIG. 9B, the isolation trenches IT' in the B–B' direction are etched down to the same level as the bottom U of the trench.

Figure 10A:
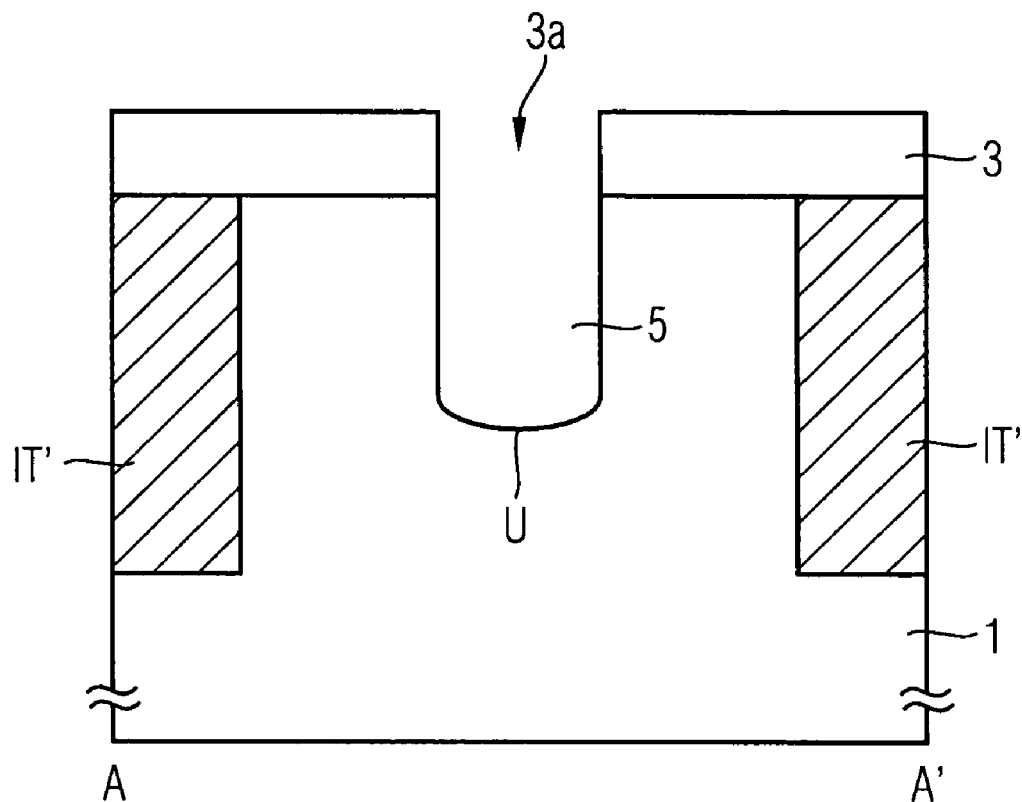
Figure 10B:
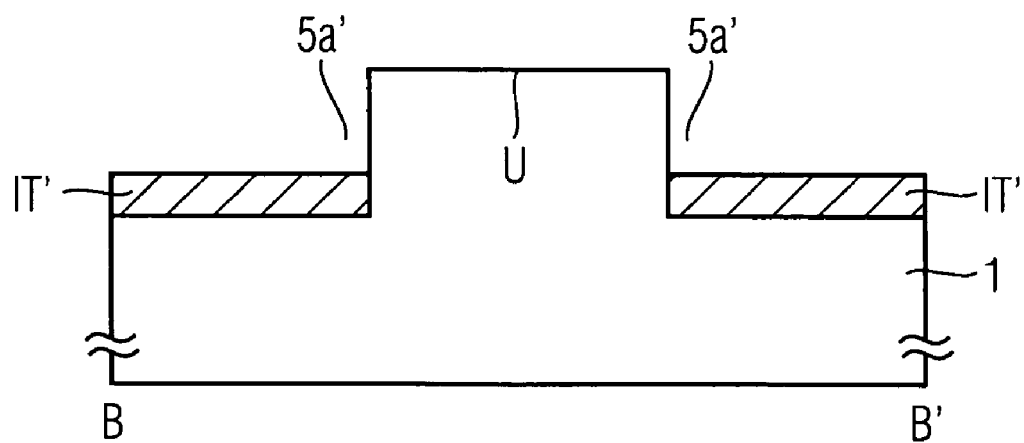

In the next process step which is depicted in FIGS. 10A, 10B, a wet etch is performed for removing a part of the silicon oxide of the isolation trenches IT' adjacent to the trench 5 in the direction B–B' as may be clearly obtained from FIG. 10B. This wet etch step etches silicon oxide with high selectivity with respect to the silicon of the silicon substrate 1. In this wet etch step, underetching areas 5a' are formed along the B–B' direction which underetching areas 5a' are located below the bottom U of the trench 5 and which are adjacent to the trench 5. By providing these underetching areas 5a, the control of the gate over the channel region is improved by the tri-gate arrangement, because the gate can be extended to below the corners at the bottom U.

Figure 11A:
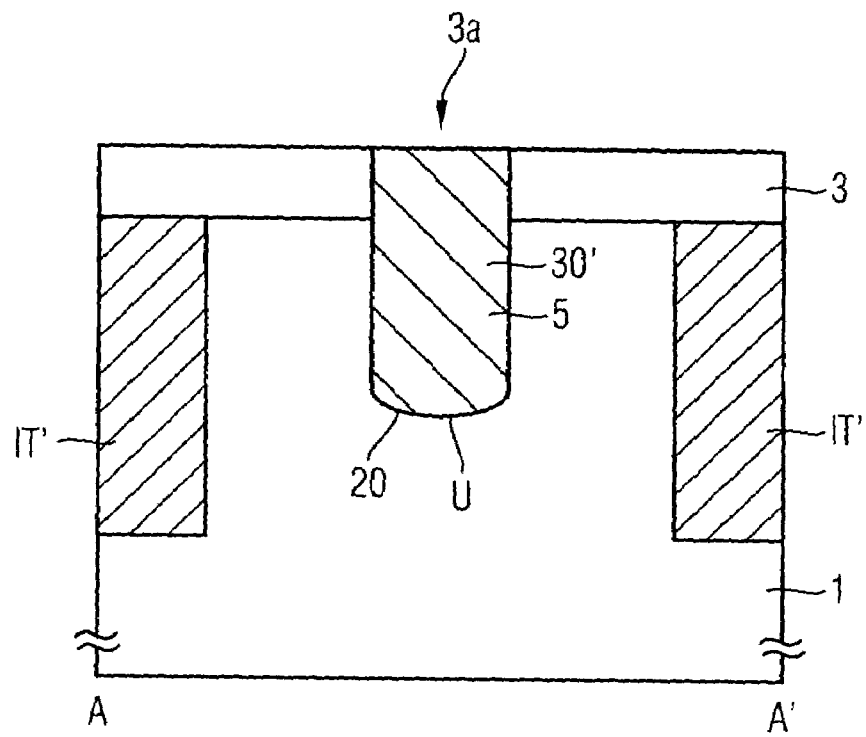
Figure 11B:
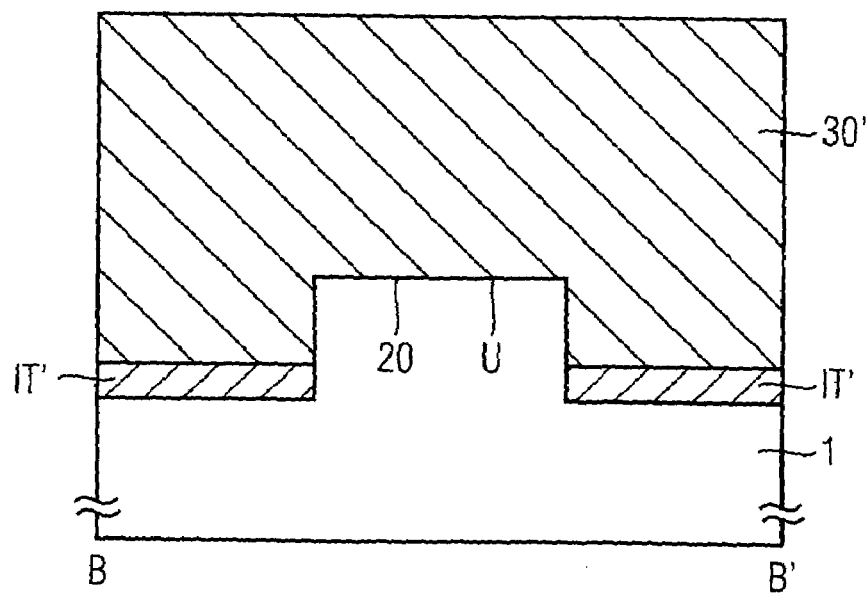

Subsequently, as shown in FIGS. 11A, 11B, a gate dielectric 20 of silicon dioxide is formed along the substrate 1 in the trench 5. Then, the trench 5 and the adjacent underetched areas 5a' in the isolation trenches IT' are filled with the gate electrode 30' made of polysilicon, preferably by a deposition and a following CMP process step. The gate electrode 30' made of polysilicon then extends to the surface of the sacrificial layer 3.

Figure 12A:
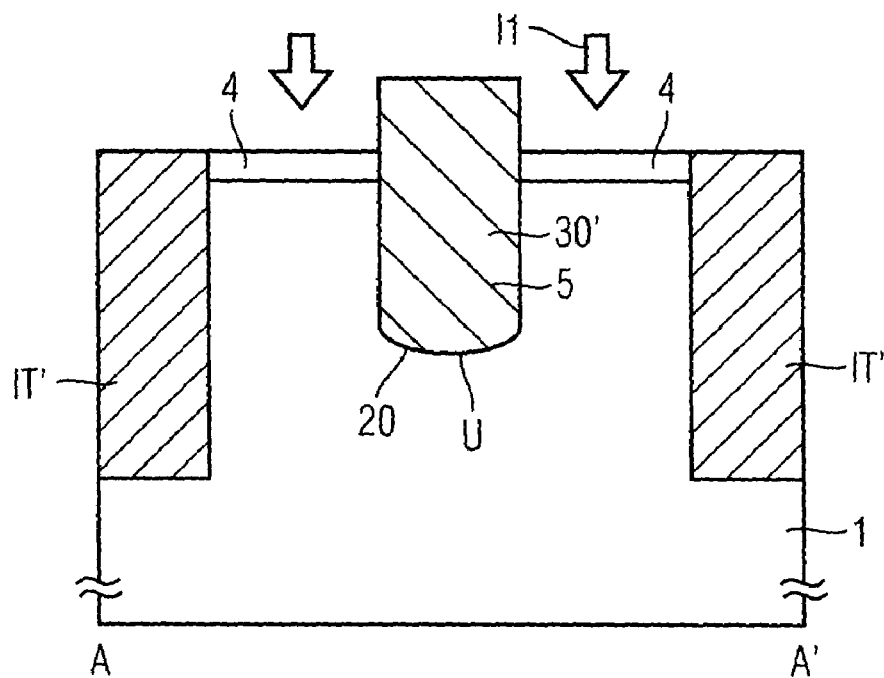
Figure 12B:
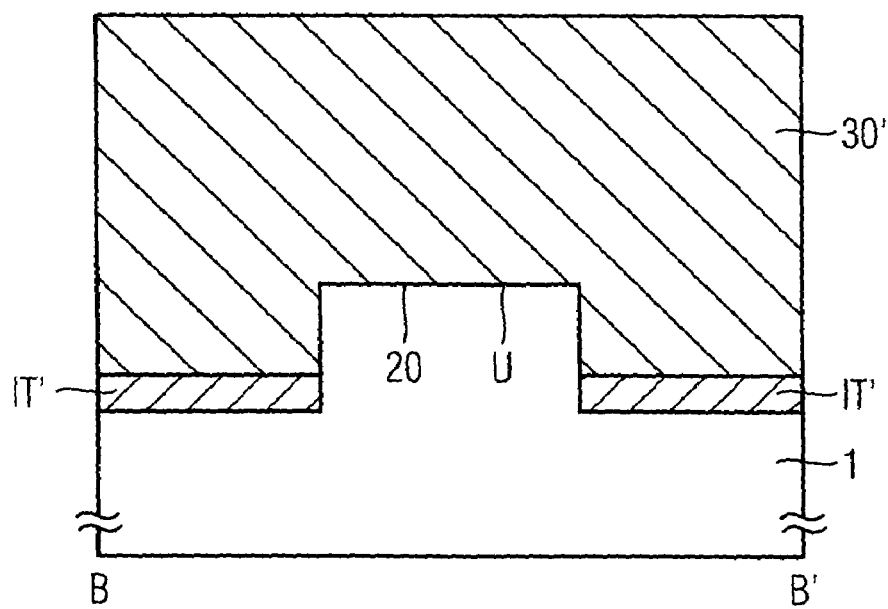

With regard to FIGS. 12A, 12B, the sacrificial layer layer 3 of silicon nitride is then removed in a selective etching step. Moreover, a first implantation I1 is performed in a self-aligned manner in order to provide a lightly doped drain/source region 4 on both sides of the trench 5 as may be obtained from FIG. 12A.

Figure 13A:
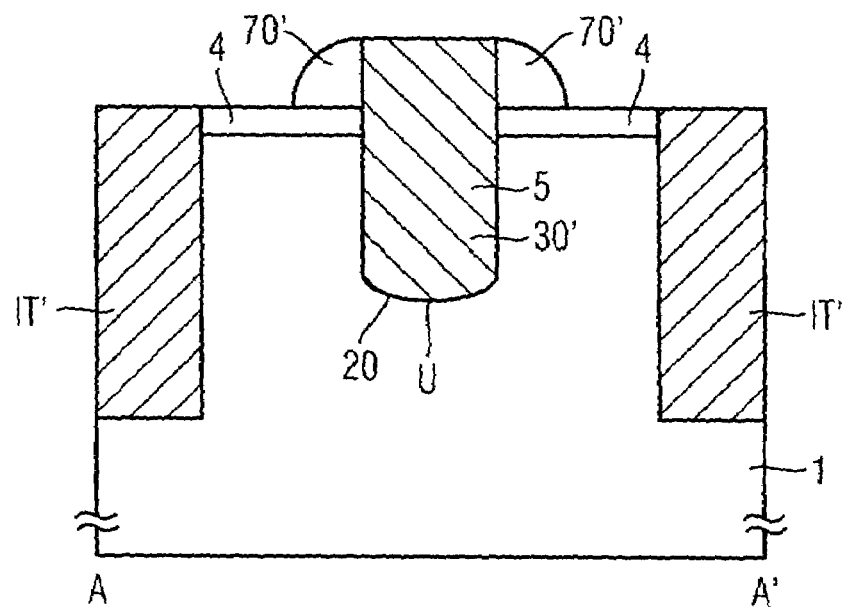
Figure 13B:
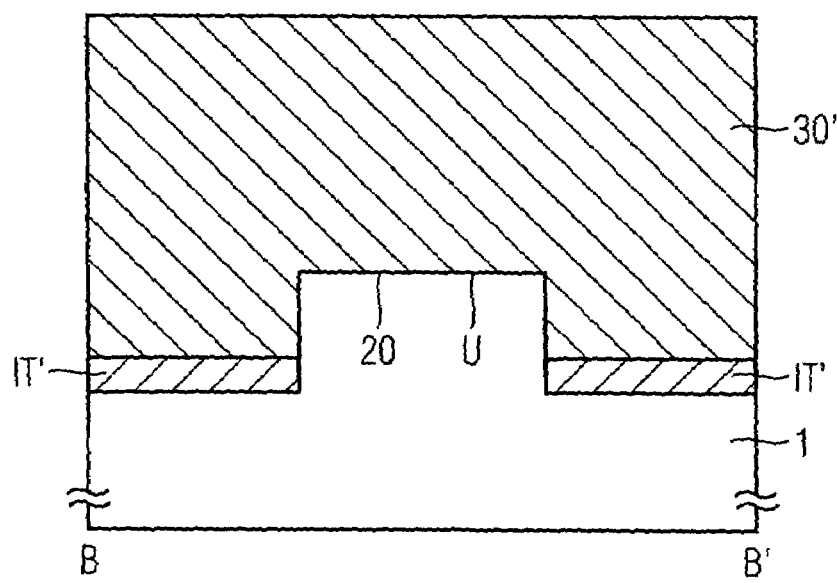
Figure 14A:
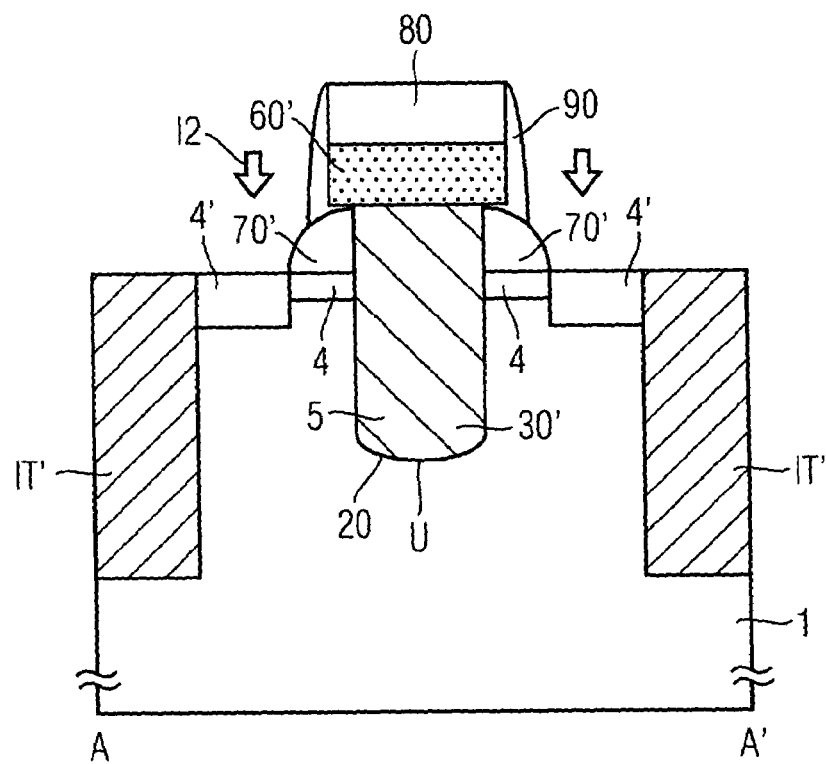
Figure 14B:
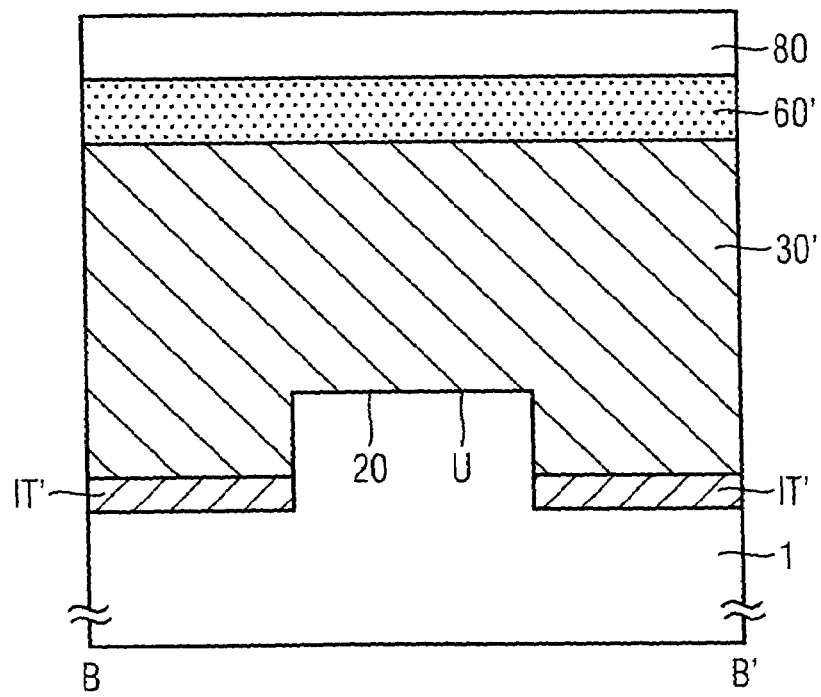

In a following process step which is depicted in FIGS. 13A, 13B, after a subsequent nitride deposition, spacers 70' are formed adjacent to the polysilicon gate electrode 30' which spacers extend along the B–B' direction. These self-adjusting spacers 70' made of silicon nitride prevent adverse electric field effects in the turned-off state of the recessed channel array transistor and provide the possibility of alignment tolerances in a later gate contact forming step.

Figure 15:
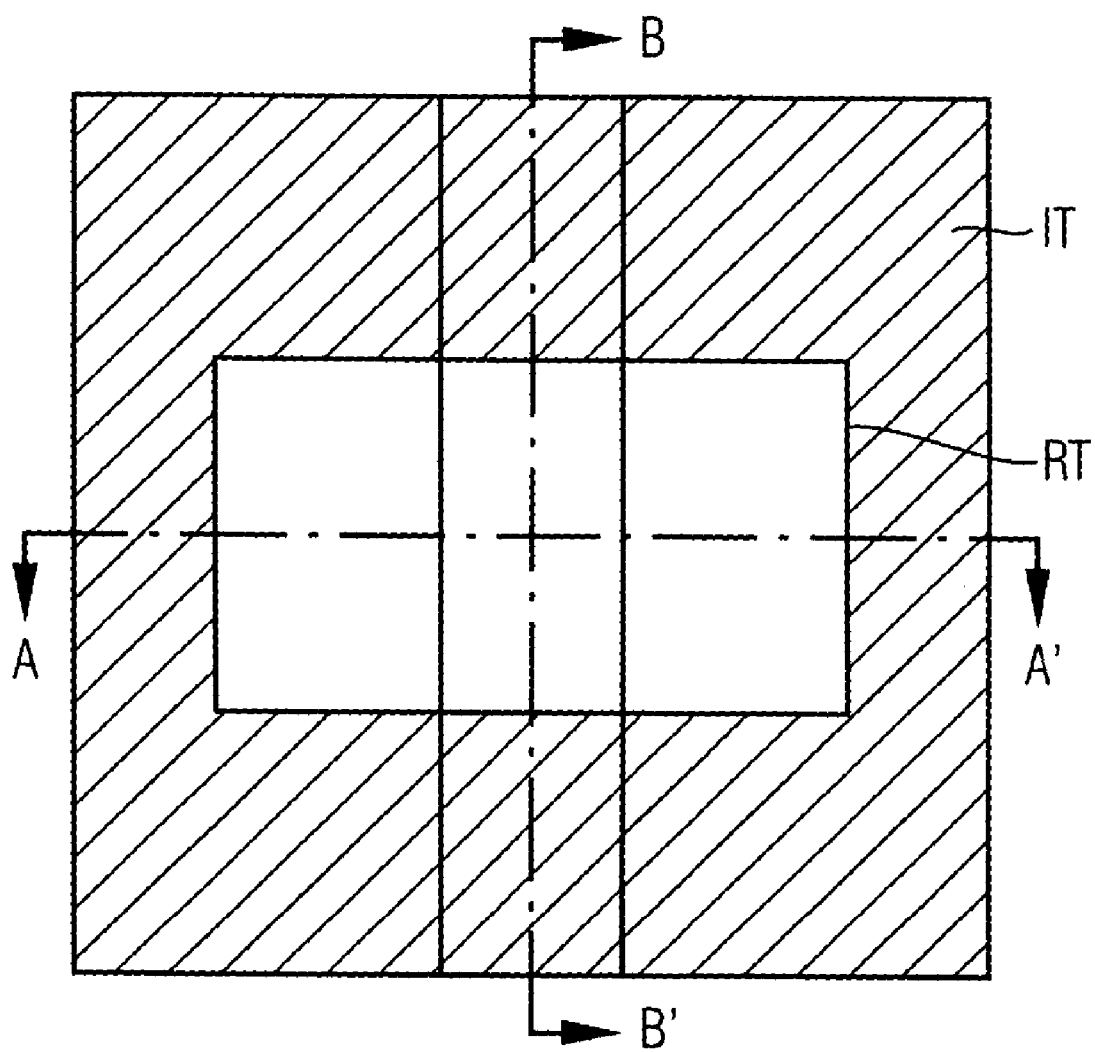
FIG. 15 shows a schematic planar view of the geometric arrangement of a recessed channel array transistor as an example of the problems underlying the present invention.
Figure 15A:
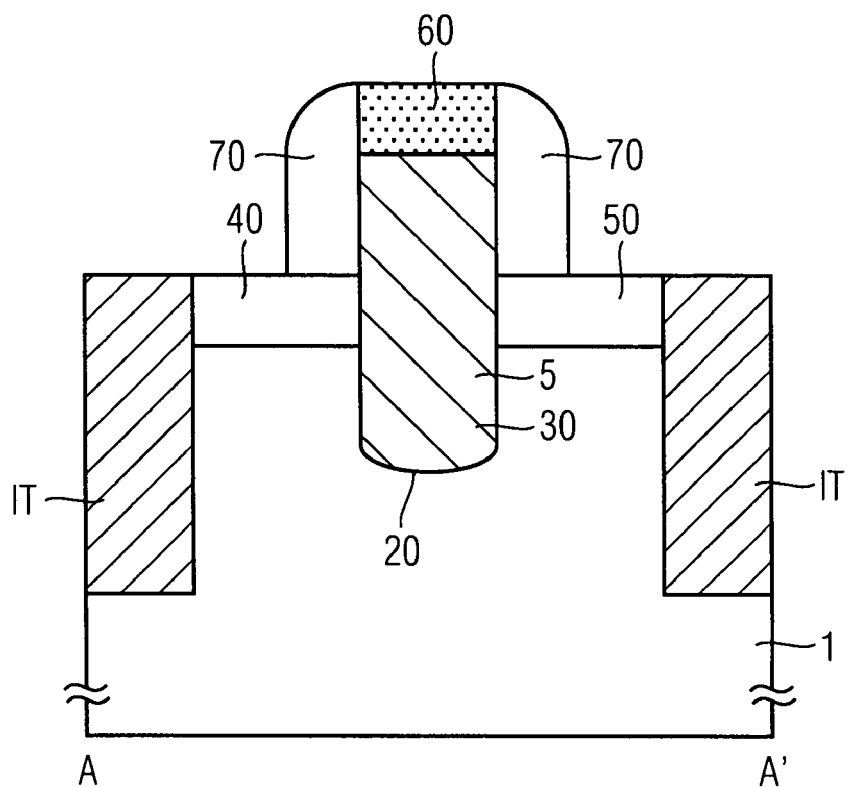
FIGS. 15A,15B show two different schematic cross-sections along lines A–A' and B–B' of FIG. 15, respectively, of a manufacturing method for a recessed channel array transistor and a corresponding recessed channel array transistor as an example of the problems underlying the present invention.
Figure 15B:
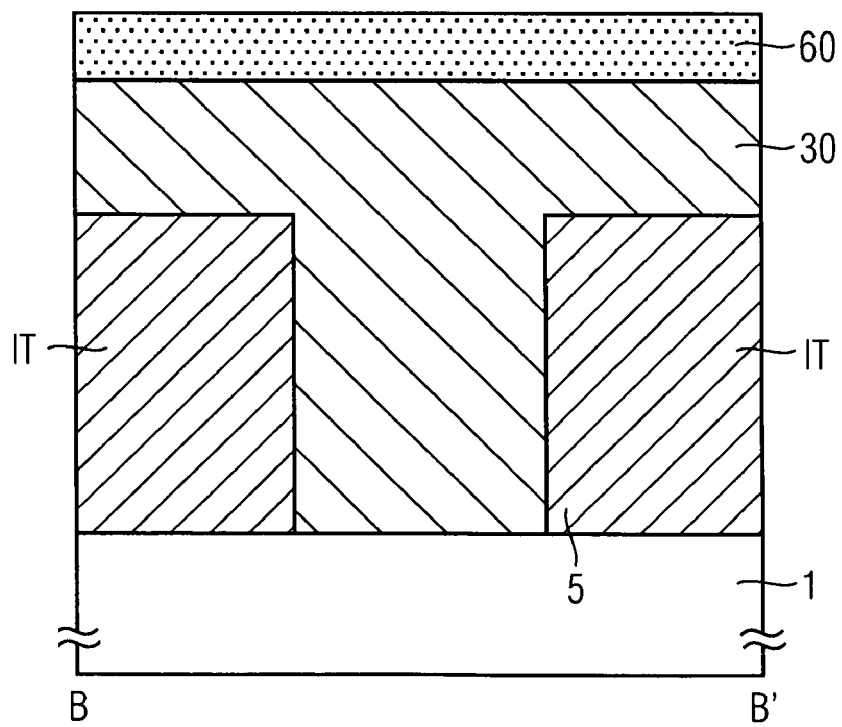

According to FIGS. 15A, 15B, a gate contact layer 60' and a cap nitride layer 80 are deposited and structured over the gate electrode 30' and the self-adjusted nitride spacer 70'. This process step is not sensitive against slight misalignments of the sacrificial layer for structuring the layers 60', 80. In a next process step, second silicon nitride spacers 90 are formed on the sides of the layer 60', 80 and on the first spacers 70'. When combining the deposition of said gate contact layer 60' with the formation of the gate contact layer of planar support devices in memory applications, a gate dielectric which is formed before the deposition of said gate contact layer has to be removed from the gate electrode 30 to ensure electrical contact between gate contact layer 60' and the gate electrode 30.

Finally, a second implantation I2 is performed for providing source/drain regions 4'. Also, this implantation I2 is self-adjusted by the isolation trenches IT and the spacers 70'. Due to the presence of the lightly doped source/drain areas 4, it can be assured that the source/drain regions 4' are suitably connected to the channel region along the trench 5 periphery. In order to expand the implanted source/drain areas 4', it is possible to perform an additional thermal diffusion step.

Thus, by the method of this second embodiment of the present invention, also a recessed channel area transistor may be formed which has excellent scaling characteristics.

Although the present invention has been described with respect to a preferred embodiment, it is not limited thereto, but can be modified in various manners which are obvious for the person skilled in the art. Particularly, the selection of the materials is only an example and can be varied variously.

LIST OF REFERENCE SIGNS

RT forming area recessed channel array transistor
1 silicon semiconductor substrate
IT,IT',IT" isolation trenches
20 gate dielectric
30,30' gate electrode
60 gate contact
40,50 source, drain
70 nitride spacer
5 trench
U bottom of trench 5
5a,5a' underetching area
4 lightly doped drain/source area (LDD)
I1 LDD implantation
70' nitride spacer
60' gate contact
80 nitride cap
90 nitride spacer
I2 S/D implantation
3 nitride sacrificial layer
3a sacrificial layer opening

What is claimed is:

1. A manufacturing method for a recessed channel array transistor, comprising:
   providing a semiconductor substrate of a first conductivity type having isolation trenches adjoining a forming area for the recessed channel array transistor at least in a first direction which is perpendicular to a current flow direction of the recessed channel array transistor, the isolation trenches being filled with an isolation material;
   forming a sacrificial layer on the surface of the semiconductor substrate;
   providing a sacrificial layer opening extending in the first direction and exposing at least the substrate in a part of the forming area;
   etching a trench in the substrate using the sacrificial layer opening as a mask opening, the trench extending in the first direction at least between the second isolation trenches;
   etching the isolation trenches for broadening the trench in the first direction and for providing an underetching region in the isolation trenches adjoining the substrate and extending below a bottom of the trench;
   forming a gate dielectric on the substrate in the trench;
   providing a gate electrode in the trench on the gate dielectric which extends to a same upper surface as the sacrificial layer;
   removing the sacrificial layer;
   forming self-adjusting first isolating spacers along the gate electrode on the substrate; and
   forming source and drain regions by introducing impurities of a second conductivity type into the exposed part of the substrate in the forming area using the first spacers as a mask.

2. The manufacturing method of claim 1, wherein the sacrificial layer opening extending in the first direction exposes at least a part of the isolation trenches and the isolation trenches are simultaneously etched with the trench.

3. The manufacturing method of claim 1, wherein the filled isolation trenches adjoining the forming area for the recessed channel array transistor are also provided in a second direction which is parallel to the current flow direction of the recessed channel array transistor.

4. The manufacturing method of claim 1, wherein the etching of the trench and the etching of the isolation trenches is performed selectively with respect to each other.

5. The manufacturing method of claim 1, wherein an additional hard mask is used for etching the sacrificial layer opening and the trench into the substrate.

6. The manufacturing method of claim 5, wherein the sacrificial layer is deposited before the forming of the isolation trenches.

7. The manufacturing method of claim 1, further comprising depositing and structuring a gate contact layer and a isolation layer above the gate electrode and the spacers.

8. The manufacturing method of claim 1, further comprising forming second isolating spacers on a structured gate contact layer and isolation layer above the gate electrode and the spacers.

9. The manufacturing method of claim 1, further comprising introducing impurities of a second conductivity type into the substrate in the forming area for providing lightly doped source/drain regions after providing the gate electrode and after removing the sacrificial layer and before forming the spacers.

* * * * *